US012687865B2

(12) United States Patent
Penley et al.

(10) Patent No.: US 12,687,865 B2
(45) Date of Patent: Jul. 21, 2026

(54) METHOD OF CONTROLLING FLUID FLOW

(71) Applicant: Ichor Systems, Inc., Fremont, CA (US)

(72) Inventors: Sean Joseph Penley, Sparks, NV (US);
Michael Maeder, Riverview, FL (US);
Marcos E. Perez-Blanco, Sparks, NV
(US); Tyler James Wright, Reno, NV
(US)

(73) Assignee: ICHOR SYSTEMS, INC.

( * ) Notice: Subject to any disclaimer, the term of this
patent is extended or adjusted under 35
U.S.C. 154(b) by 137 days.

(21) Appl. No.: 18/448,549

(22) Filed: Aug. 11, 2023

(65) Prior Publication Data

US 2024/0053776 A1 Feb. 15, 2024

Related U.S. Application Data

(60) Provisional application No. 63/397,020, filed on Aug.
11, 2022.

(51) Int. Cl.
*G05D 7/06* (2006.01)
*H10P 72/00* (2026.01)

(52) U.S. Cl.
CPC ....... *G05D 7/0658* (2013.01); *H10P 72/0404*
(2026.01)

(58) Field of Classification Search
CPC .. G05D 7/0652; G05D 7/0658; F16K 27/003;
H10P 14/6502; H10P 72/0612; G05B
13/024
See application file for complete search history.

(56) References Cited

U.S. PATENT DOCUMENTS

| | | | | | |
|---|---|---|---|---|---|
| 6,035,893 A | * | 3/2000 | Ohmi | .................... | F16K 27/003 |
| | | | | | 137/884 |
| 6,772,781 B2 | * | 8/2004 | Doty | .................... | G05D 11/132 |
| | | | | | 137/607 |
| 6,773,749 B1 | * | 8/2004 | Moore | ................ | C23C 16/4412 |
| | | | | | 427/248.1 |
| 7,775,236 B2 | * | 8/2010 | Gold | ................. | H01L 21/67098 |
| | | | | | 137/487.5 |
| 8,074,677 B2 | * | 12/2011 | Gold | .................... | H01J 37/3244 |
| | | | | | 702/45 |
| 8,408,245 B2 | * | 4/2013 | Feldman | ............. | F16K 27/0263 |
| | | | | | 251/63 |
| 10,550,947 B2 | * | 2/2020 | Koyama | .................... | F16K 7/16 |

(Continued)

OTHER PUBLICATIONS

International Search Report issued in counterpart Application No.
PCT/US23/72000 on Dec. 18, 2023.

*Primary Examiner* — Reinaldo Sanchez-Medina
(74) *Attorney, Agent, or Firm* — The Belles Group, P.C.

(57) ABSTRACT

Systems for processing articles are essential for semicon-
ductor fabrication. In one method of controlling gas flow, a
processing system is provided, the processing system having
first and second fluid supplies. The first fluid supply is
coupled to a first apparatus for controlling flow and the
second fluid supply is coupled to the second apparatus for
controlling flow. The first process fluid is then delivered to
a process chamber via outlet of the first apparatus for
controlling flow. The first process fluid is also bled via a
bleed port of the first apparatus for controlling flow. The
flow rate of the first process fluid through the bleed port is
controlled at a first flow rate which is less than a first
threshold.

19 Claims, 16 Drawing Sheets

(56)          References Cited

U.S. PATENT DOCUMENTS

| | | | |
|---|---|---|---|
| 2003/0136446 A1* | 7/2003 | Young, Jr. ......... | H01L 21/67017 |
| | | | 137/377 |
| 2005/0067021 A1* | 3/2005 | Bevers ................... | G01F 25/13 |
| | | | 137/487.5 |
| 2011/0051546 A1 | 3/2011 | Finley et al. | |
| 2016/0216713 A1* | 7/2016 | Mudd ...................... | G01F 1/36 |
| 2017/0271184 A1 | 9/2017 | Brashear et al. | |
| 2019/0243393 A1* | 8/2019 | Mudd ................. | G05D 7/0682 |
| 2019/0258279 A1* | 8/2019 | Penley .................. | G05D 11/13 |
| 2020/0400470 A1* | 12/2020 | Mudd .................. | F16K 27/003 |
| 2021/0004027 A1* | 1/2021 | Mudd ................. | G05D 7/0126 |

* cited by examiner

METHOD OF CONTROLLING FLUID FLOW

CROSS-REFERENCE TO RELATED APPLICATIONS

This application claims the benefit of U.S. Provisional Application 63/397,020, filed Aug. 11, 2022, which is incorporated herein by reference in its entirety.

BACKGROUND OF THE INVENTION

Mass flow control has been one of the key technologies used in semiconductor chip fabrication. Apparatuses for controlling mass flow are important for delivering known flow rates of process gases and liquids for semiconductor fabrication and other industrial processes. Such devices are used to measure and accurately control the flow of fluids for a variety of applications. In a given fabrication tool, processing systems of the fabrication tool incorporates a variety of apparatuses for controlling flow to deliver a variety of liquids and gases. As a result, efficient gas and liquid handling is essential to modern semiconductor fabrication equipment.

As the technology of chip fabrication has improved, so has the demand on the apparatuses for controlling flow. Semiconductor fabrication processes increasingly require increased performance, a greater range of flow capability, more process gases and liquids, and more compact installation of the necessary equipment. Improved gas and liquid handling for a variety of flow apparatuses is desirable to deliver enhanced performance in reduced space and at a reduced cost while avoiding undesired chemical interactions.

SUMMARY OF THE INVENTION

The present technology is directed to methods of controlling fluid flows in systems for processing articles such as semiconductors. In other embodiments, the present technology is directed to systems for controlling flows of process fluids. In yet other embodiments, the present technology is directed to systems for transporting process fluids. In other embodiments, the present technology is directed to apparatuses for controlling flow of process fluids. The present systems, methods, and apparatuses may be used in a wide range of processes such as semiconductor chip fabrication, solar panel fabrication, etc.

In one implementation, the invention is a method of controlling fluid flow. In a first step, a processing system is provided. The processing system comprises a first fluid supply configured to supply a first process fluid and a second fluid supply configured to supply a second process fluid. The first fluid supply is fluidly coupled to an inlet of a first apparatus for controlling flow and the second fluid supply fluidly coupled to a second apparatus for controlling flow. In a second step, the first process fluid is delivered to a processing chamber fluidly coupled to an outlet of the first apparatus for controlling flow. In a third step, the first process fluid is vented to a vent manifold fluidly coupled to a bleed port of the first apparatus for controlling flow at a first flow rate which is less than a first threshold.

In another implementation, the invention is a method of controlling fluid flow. In a first step, a processing system is provided. The processing system comprises a first fluid supply configured to supply a first process fluid and a second fluid supply configured to supply a second process fluid. The first fluid supply is fluidly coupled to an inlet of a first apparatus for controlling flow and the second fluid supply fluidly coupled to a second apparatus for controlling flow. In a second step, the first process fluid is delivered to a processing chamber fluidly coupled to an outlet of the first apparatus for controlling flow. In a third step, the first process fluid is vented to a vent manifold fluidly coupled to a bleed port of the first apparatus for controlling flow at a first flow rate and simultaneously venting the second process fluid to the vent manifold fluidly coupled to a bleed port of the second apparatus for controlling flow at a second flow rate to control a concentration of the first process fluid within the vent manifold below a second threshold.

In one implementation, the invention is a method of controlling fluid flow. In a first step, a processing system is provided. The processing system comprises a first fluid supply configured to supply a first process fluid and a second fluid supply configured to supply a second process fluid. The first fluid supply is fluidly coupled to an inlet of a first apparatus for controlling flow and the second fluid supply fluidly coupled to a second apparatus for controlling flow. In a second step, the first process fluid is vented to a vent manifold fluidly coupled to a bleed port of the first apparatus for controlling flow at a first flow rate, a concentration of the first process fluid within the vent manifold being below a second threshold. In a third step, the first process fluid is delivered to a processing chamber fluidly coupled to an outlet of the first apparatus for controlling flow.

Further areas of applicability of the present technology will become apparent from the detailed description provided hereinafter. It should be understood that the detailed description and specific examples, while indicating the preferred implementation, are intended for purposes of illustration only and are not intended to limit the scope of the technology.

BRIEF DESCRIPTION OF THE DRAWINGS

The invention of the present disclosure will become more fully understood from the detailed description and the accompanying drawings, wherein.

DETAILED DESCRIPTION

Figure 1:
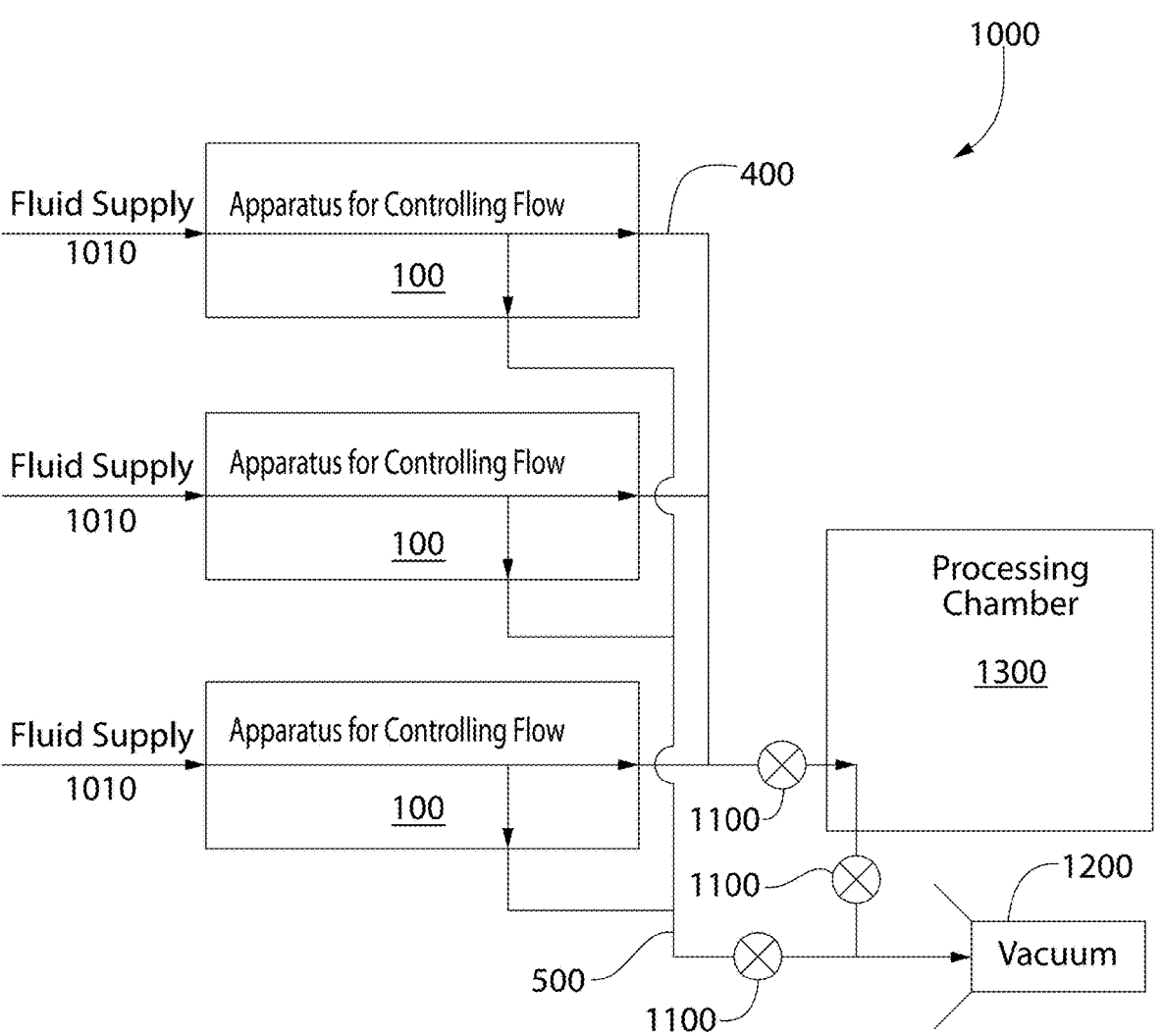
FIG. 1 is a schematic of a processing system for manufacturing semiconductor devices utilizing one or more apparatuses for controlling flow.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "left," "right," "top" and "bottom" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combinations of features that may exist alone or in other combinations of features; the scope of the invention being defined by the claims appended hereto.

The present invention is directed to systems for processing articles, these systems having apparatuses for controlling fluid flow. In some embodiments, the apparatus may function as a mass flow controller to deliver a known mass flow of gas or liquid to a semiconductor or similar process. Semiconductor fabrication is one industry which demands high performance in control of fluid flows. As semiconductor fabrication techniques have advanced, customers have recognized the need for flow control devices with increased accuracy and repeatability in the mass of the delivered fluid flows. In addition, flow control devices have increased in complexity, utilizing more sophisticated arrangements that require delivery and removal of a variety of process fluids. The present systems enable rapid assembly and maintenance of systems for processing articles by utilizing standardized manifold configurations.

FIG. 1 shows a schematic of an exemplary processing system 1000 for processing articles. The processing system 1000 may utilize a plurality of apparatus for controlling flow 100 fluidly coupled to a processing chamber 1300. Each of the plurality of apparatus for controlling flow 100 has a fluid supply 1010 fluidly coupled thereto, each of the fluid supplies 1010 suppling a process fluid to their respective apparatuses for controlling flow 100. Optionally, a plurality of fluid supplies 1010 may be fluidly coupled to a single apparatus for controlling flow 100 or a plurality of apparatuses for controlling flow 100 may be fluidly coupled to a single fluid supply 1010. Each of the fluid supplies 1010 may deliver a different process fluid or a portion of the fluid supplies 1010 may deliver a single process fluid.

The plurality of apparatus for controlling flow 100 are used to supply one or more different process fluids to the processing chamber 1300 via an outlet manifold 400. Articles such as semiconductors may be processed within the processing chamber 1300. A valve 1100 isolates the apparatuses for controlling flow 100 from the processing chamber 1300, enabling the apparatuses for controlling flow 100 to be selectively connected or isolated from the processing chamber 1300. The processing chamber 1300 may contain one or more applicators to apply process fluids delivered by the plurality of apparatus for controlling flow 100, enabling selective or diffuse distribution of the fluid supplied by the plurality of apparatus for controlling flow 100.

In addition, the processing system 1000 may further comprise a vacuum source 1200 which is isolated from the processing chamber 1300 by a valve 1100 to enable evacuation of process fluids or facilitate purging one or more of the apparatus for controlling flow 100 to enable switching between process fluids in the same apparatus for controlling flow 100. Each of the apparatuses for controlling flow 100 may have a separate bleed port which is coupled to a vent manifold 500, the vent manifold 500 connected to the vacuum source 1200 via a valve 1100. Optionally, the apparatuses for controlling flow 100 may be mass flow controllers, flow splitters, or any other device which controls the flow of a process fluid in a processing system. Furthermore, valves 1100 may be integrated into the apparatus for controlling flow 100 if so desired. In some implementations this may eliminate the need for certain other valves 1100 in the processing system 1000.

Processes that may be performed in the processing system 1000 may include wet cleaning, photolithography, ion implantation, dry etching, atomic layer etching, wet etching, plasma ashing, rapid thermal annealing, furnace annealing, thermal oxidation, chemical vapor deposition, atomic layer deposition, physical vapor deposition, molecular beam epitaxy, laser lift-off, electrochemical deposition, chemical-mechanical polishing, wafer testing, or any other process utilizing controlled volumes of a process fluid.

Figure 2:
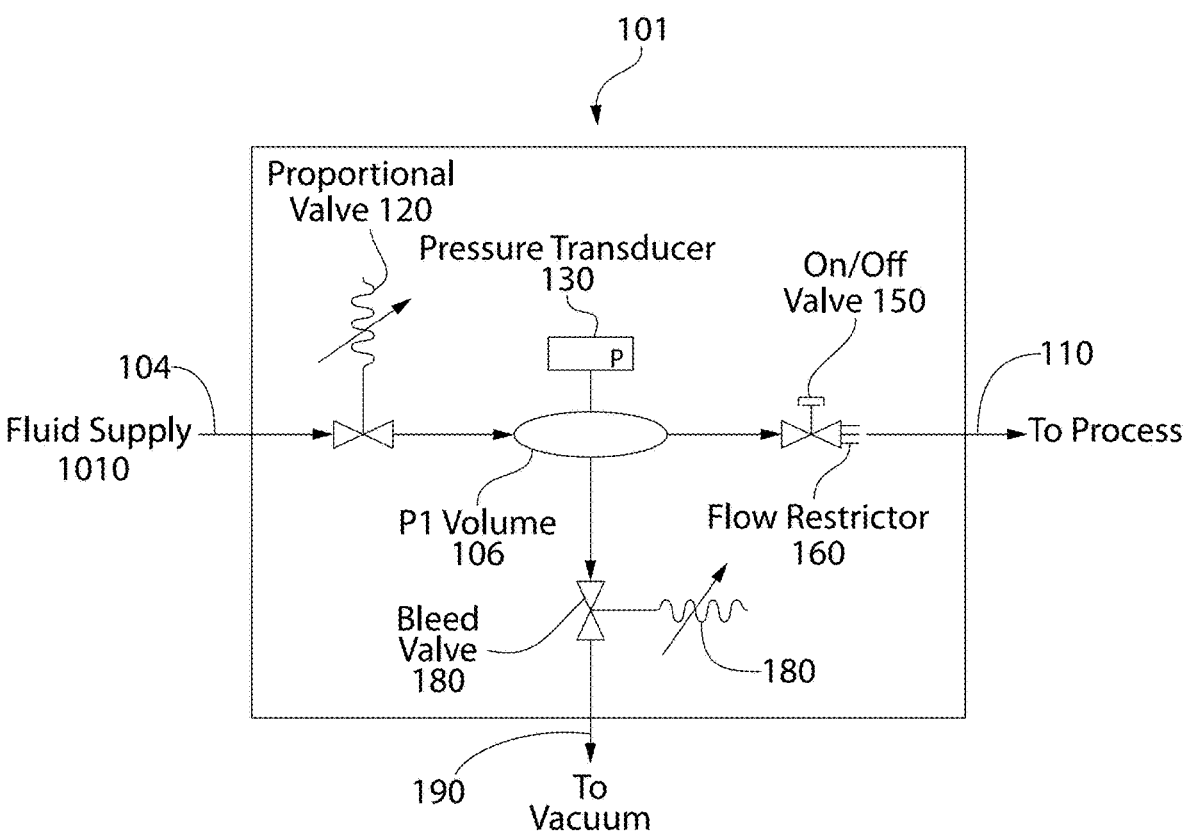
FIG. 2 is a schematic of a mass flow controller, the mass flow controller being one of the apparatuses for controlling flow as may be utilized in the process of FIG. 1.

FIG. 2 shows a schematic of an exemplary mass flow controller 101, which is one type of apparatus for controlling flow 100 that may be utilized in the processing system 1000. The mass flow controller 101 has a fluid supply 1010 of a process fluid fluidly coupled to an inlet 104. The inlet 104 is fluidly coupled to a proportional valve 120 which is capable of varying the mass and volume of process fluid flowing through the proportional valve 120. The proportional valve 120 meters the mass flow of process fluid which passes to a P1 volume 106. The proportional valve 120 is capable of providing proportional control of the process fluid such that it need not be fully open or closed, but instead may have intermediate states to permit control of the mass flow rate of process fluid.

The P1 volume 106 is fluidly coupled to the proportional valve 120, the P1 volume 106 being the sum of all the volume within the mass flow controller 101 between the proportional valve 120 and a flow restrictor 160. A pressure transducer 130 is fluidly coupled to the P1 volume 106 to enable measurement of the pressure within the P1 volume 106. A shutoff valve 150 is located between the flow restrictor 160 and the proportional valve 120 and may be used to completely halt flow of the process fluid out of the P1 volume 106. Optionally, the flow restrictor 160 may be located between the shutoff valve 150 and the proportional valve 120 in an alternate configuration. The flow restrictor 160 is fluidly coupled to an outlet 110 of the mass flow controller 101. In the processing system, the outlet 110 is fluidly coupled to a valve 1100 or directly to the processing chamber 1300. In the present embodiment, the flow restrictor 160 is located between the shutoff valve 150 and the outlet 110. In an alternate embodiment, the shutoff valve 150 is located between the flow restrictor 160 and the outlet 110. Thus, the arrangement of the shutoff valve 150 and the flow restrictor 160 may be reversed.

Finally, a bleed valve 180 is coupled to the P1 volume 106 and to a bleed port 190. In the present example, the bleed valve 180 is a proportional valve. The bleed valve 180 may also be an on/off valve or any other type of valve suitable for controlling fluid flow. Optionally, a second flow restrictor 160 may be incorporated between the P1 volume and the bleed port 190. A proportional valve, if used as the bleed valve 180, enables control over a rate of fluid flow through the bleed port 190. A characterized restrictor 160 may aid in improving control over the rate of fluid flow, regardless of whether the bleed valve 180 is a proportional valve or an on/off valve. Preferably, the rate of fluid flow through the bleed valve 180 is characterized so that the flow rate can be estimated for a given state of the bleed valve 180.

Internal to the first shutoff valve 150 is a valve seat and a closure member. When the apparatus 100 is delivering process fluid, the first shutoff valve 150 is in an open state, such that the valve seat and the closure member are not in contact. This permits flow of the process fluid and provides a negligible restriction to fluid flow. When the first shutoff valve 150 is in a closed state the closure member and the valve seat are biased into contact by a spring, stopping the flow of process fluid through the first shutoff valve 150.

The flow restrictor 160 is used, in combination with the proportional valve 120, to meter flow of the process fluid. In most embodiments, the flow restrictor 160 provides a known restriction to fluid flow. The first characterized flow restrictor 160 may be selected to have a specific flow impedance so as to deliver a desired range of mass flow rates of a given process fluid. The flow restrictor 160 has a greater resistance to flow than the passages upstream and downstream of the flow restrictor 160.

Optionally, the mass flow controller 101 comprises one or more P2 pressure transducers downstream of the flow restrictor 160 and the shutoff valve 150. The P2 pressure transducer is used to measure the pressure differential across the flow restrictor 160. In some embodiments, the P2 pressure downstream of the flow restrictor 160 may be obtained from another apparatus 100 connected to the processing chamber, with the readings communicated to the mass flow controller 101.

Optionally, temperature sensors may be employed to further enhance the accuracy of the mass flow controller 101. They may be mounted in the base of the mass flow controller 101 near the P1 volume 106. Additional temperature sensors may be employed in a variety of locations, including adjacent the proportional valve 120, the pressure transducer 130, the shutoff valve 150, and the bleed valve 180.

Figure 3:
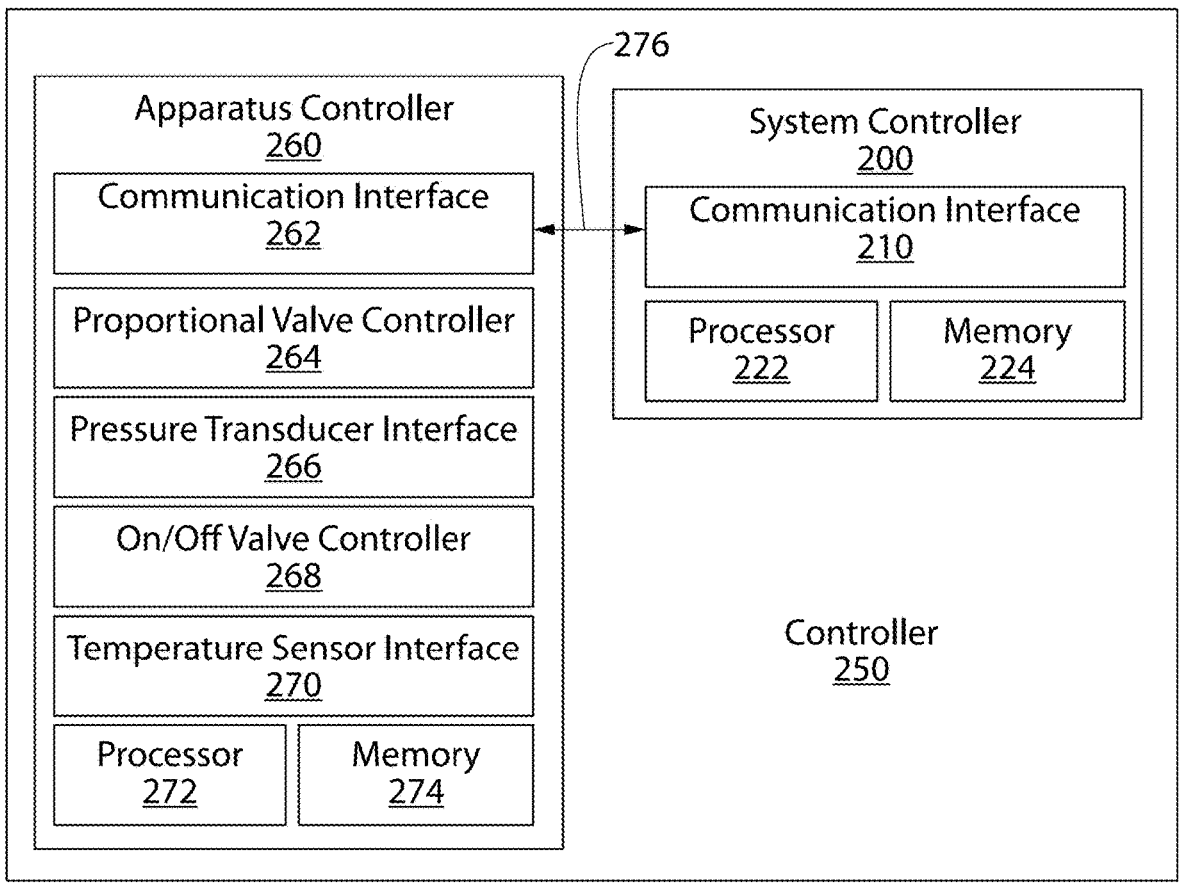
FIG. 3 block diagram illustrating a control system as may be utilized in the system of FIG. 1.

Turning to FIG. 3, a block diagram illustrates a controller 250 for the processing system 1000 of FIG. 1. This block diagram shows an apparatus controller 260 and a system controller 200. The apparatus controller 260 provides all control functions for an apparatus for controlling flow 100 within the processing system 1000. The apparatus controller 260 has a communication interface 262, a proportional valve controller 264, a pressure transducer interface 266, an on/off valve controller 268, a temperature sensor interface 270, a processor 272, and memory 272. The communication interface 262 is configured to provide a communications link between the apparatus controller 260 and the system controller 200. Optionally, the temperature sensor interface 270 may be omitted if the additional accuracy provided by a temperature sensor is not required. Optionally, a single apparatus controller 260 may operate a plurality of apparatuses for controlling flow 100 or each apparatus for controlling flow 100 may have a dedicated apparatus controller 260, each of the apparatus controllers 260 communicating with the system controller 200 and other apparatus controllers 260 via a communications bus 276.

The system controller 200 has a corresponding communication interface 210, a processor 222, and memory 224. The system controller 200 coordinates all high-level functions necessary to perform the desired process. The communication interface 210 of the system controller 200 sends and receives commands through the communications bus 276. The communications bus 276 connects to the communication interface 262 of the apparatus controller 260. The communications bus 276 may connect the system controller 200 to a single apparatus controller 200, or it may connect to a plurality of apparatus controllers 200, each apparatus controller 200 operating a distinct apparatus for controlling flow 100. Not all apparatus controllers 200 need control an apparatus for controlling gas flow 100. Instead, other types of process equipment may also be controlled. Furthermore, there may be a plurality of communications buses 276 to connect all the devices required to perform the desired process. In other implementations, the communications bus 276 may be substituted with a plurality of direct communications links between individual controllers 200, 260.

Figure 4:
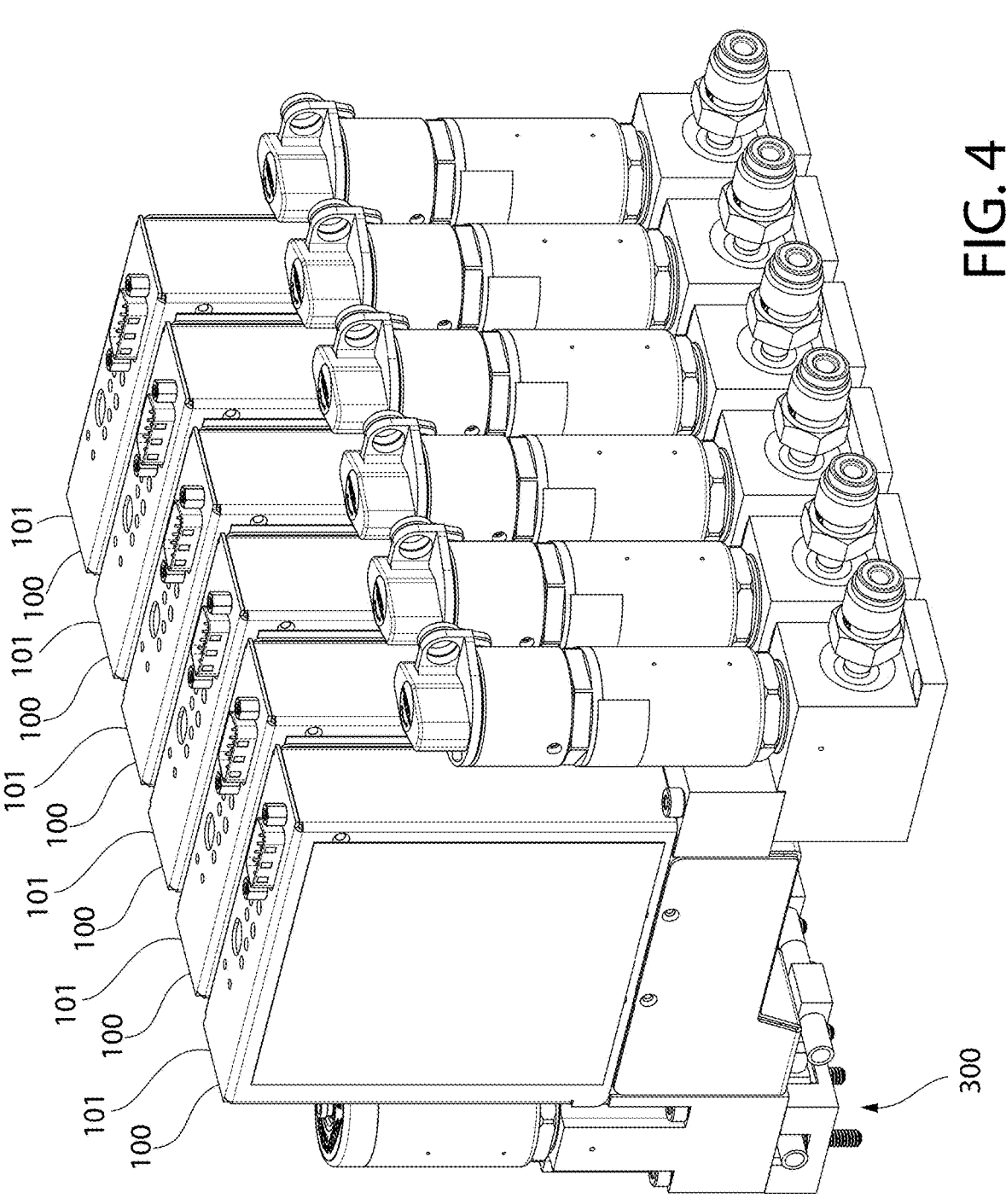
FIG. 4 is a perspective view of a plurality of apparatuses for controlling flow and a manifold system as may be utilized in the system of FIG. 1.
Figure 5:
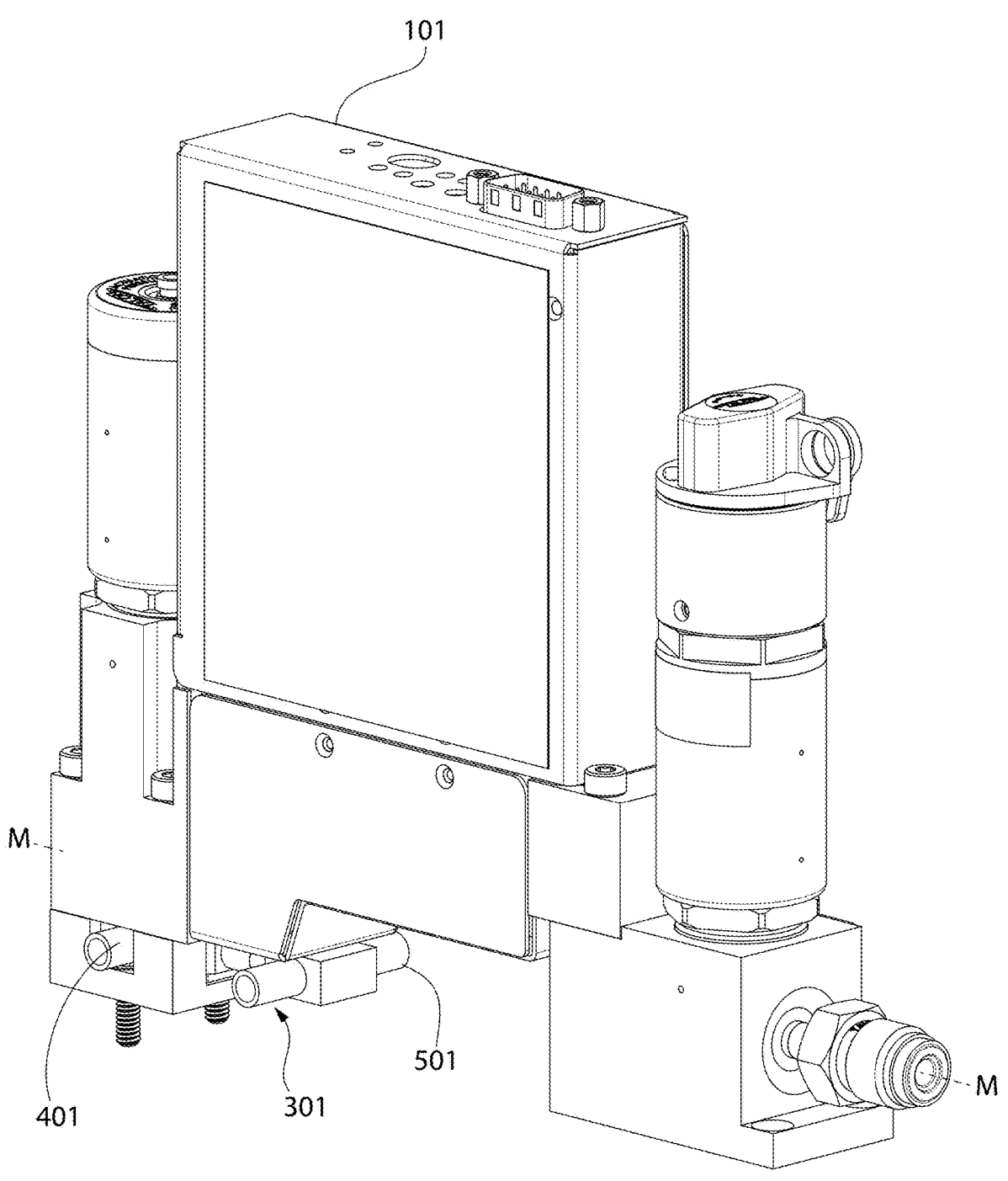
FIG. 5 is a perspective view of a mass flow controller and a portion of the manifold system, the mass flow controller being one of the apparatuses for controlling flow as may be utilized in the system of FIG. 1.
Figure 6:
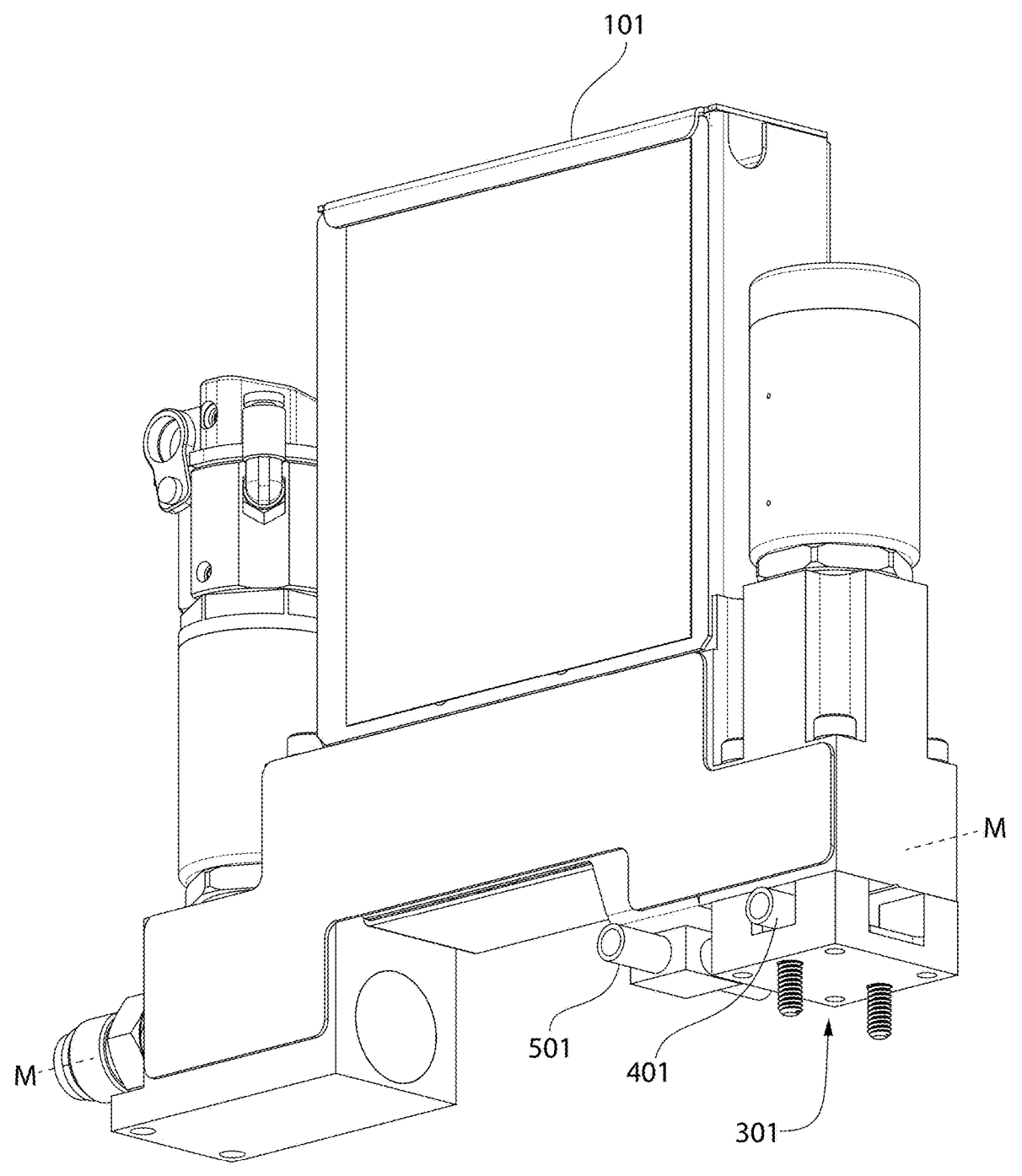
FIG. 6 is a lower perspective view of the mass flow controller and the portion of the manifold system of FIG. 5.
Figure 7:
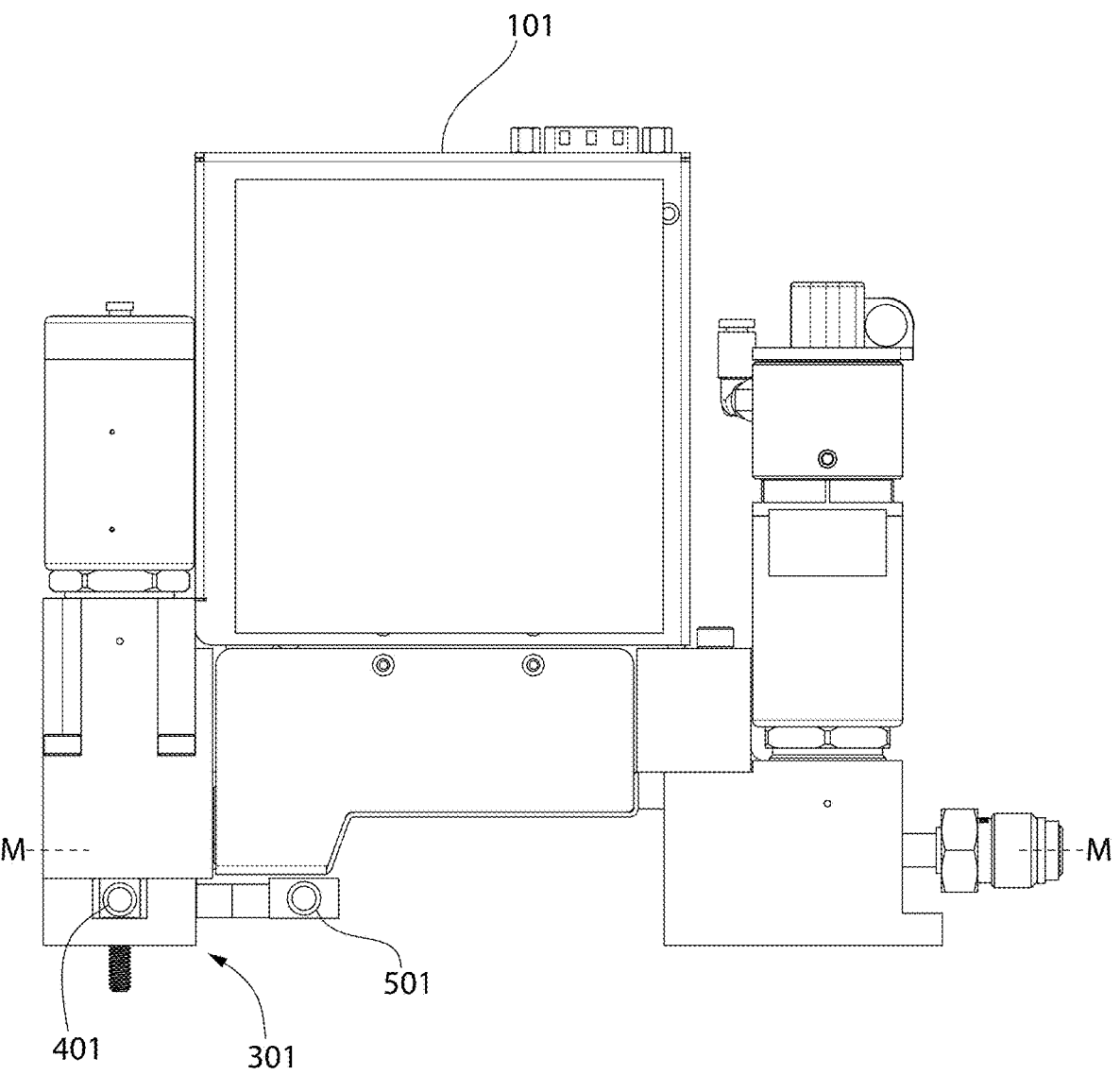
FIG. 7 is a left side view of the mass flow controller and the portion of the manifold system of FIG. 5.
Figure 8:
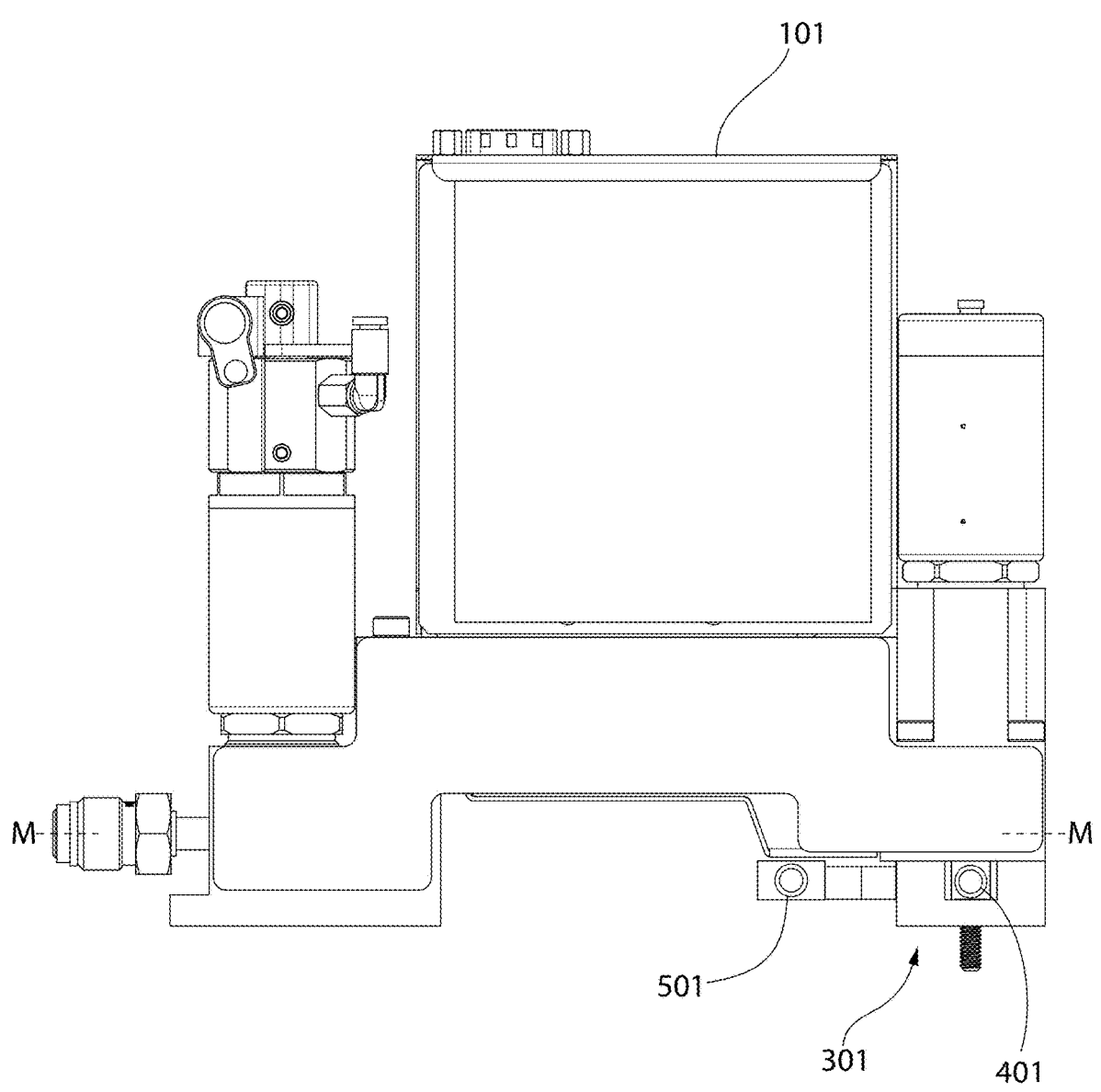
FIG. 8 is a right side view of the mass flow controller and the portion of the manifold system of FIG. 5.
Figure 9:
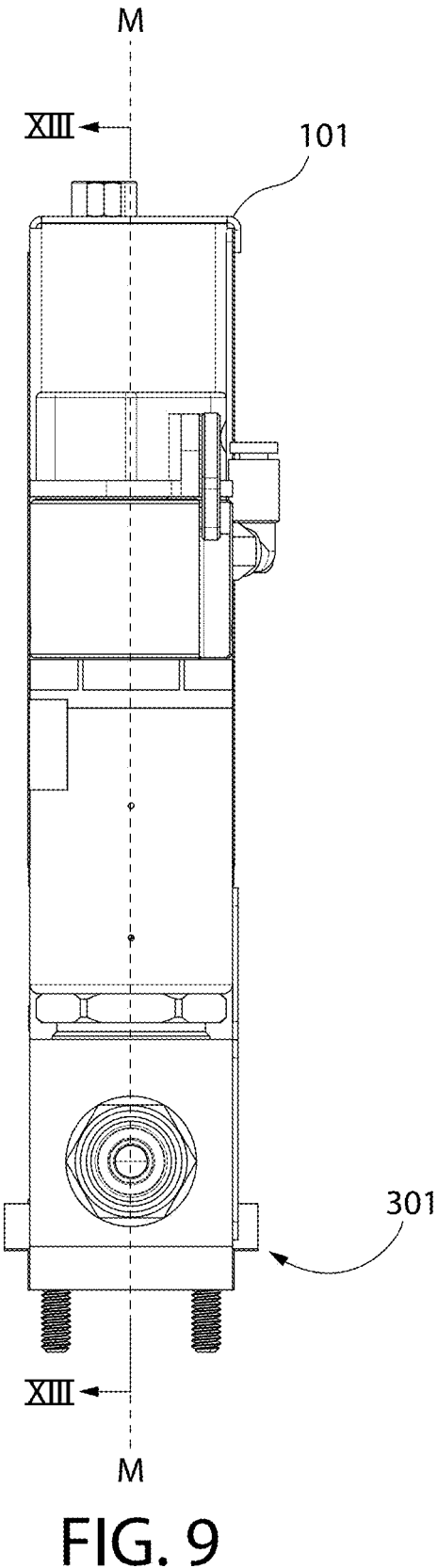
FIG. 9 is a front view of the mass flow controller and the portion of the manifold system of FIG. 5.
Figure 10:
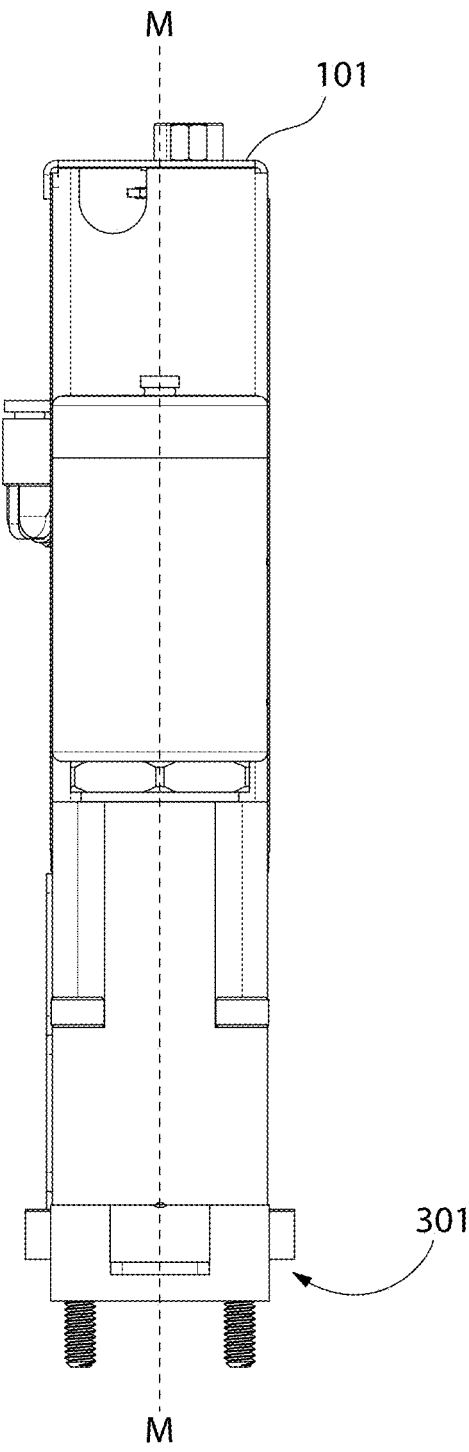
FIG. 10 is a rear view of the mass flow controller and the portion of the manifold system of FIG. 5.
Figure 11:
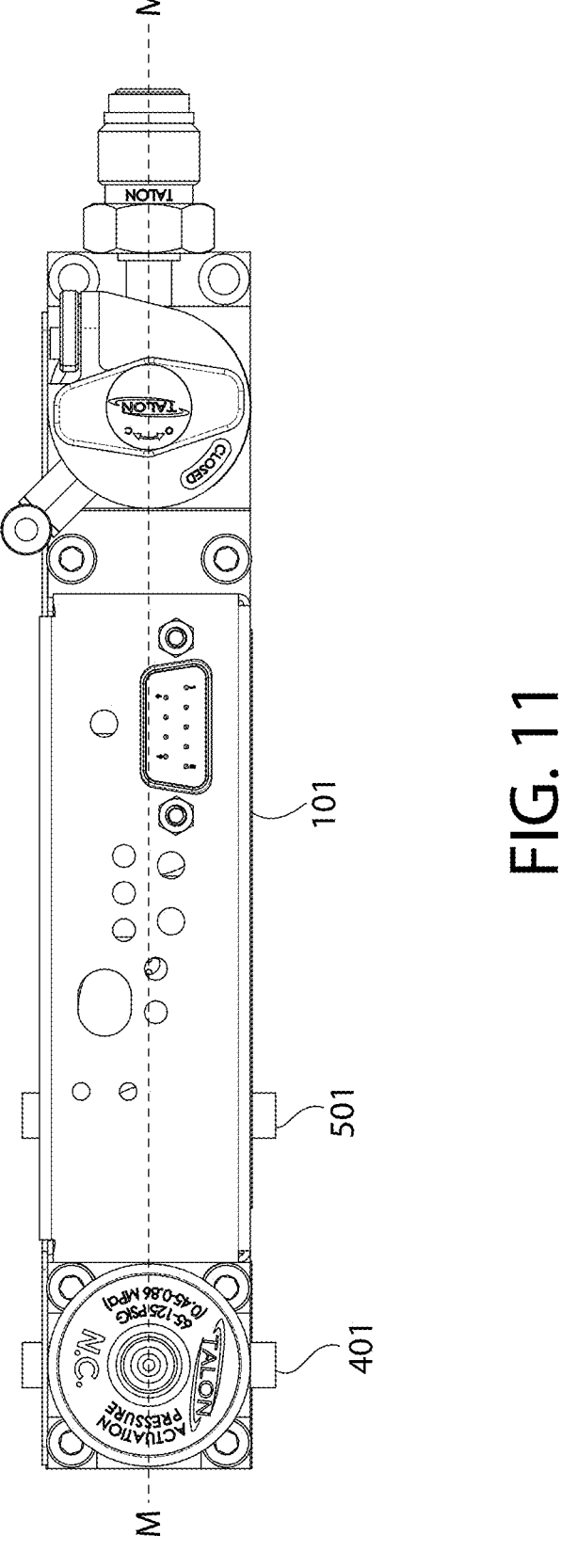
FIG. 11 is a top view of the mass flow controller and the portion of the manifold system of FIG. 5.
Figure 12:
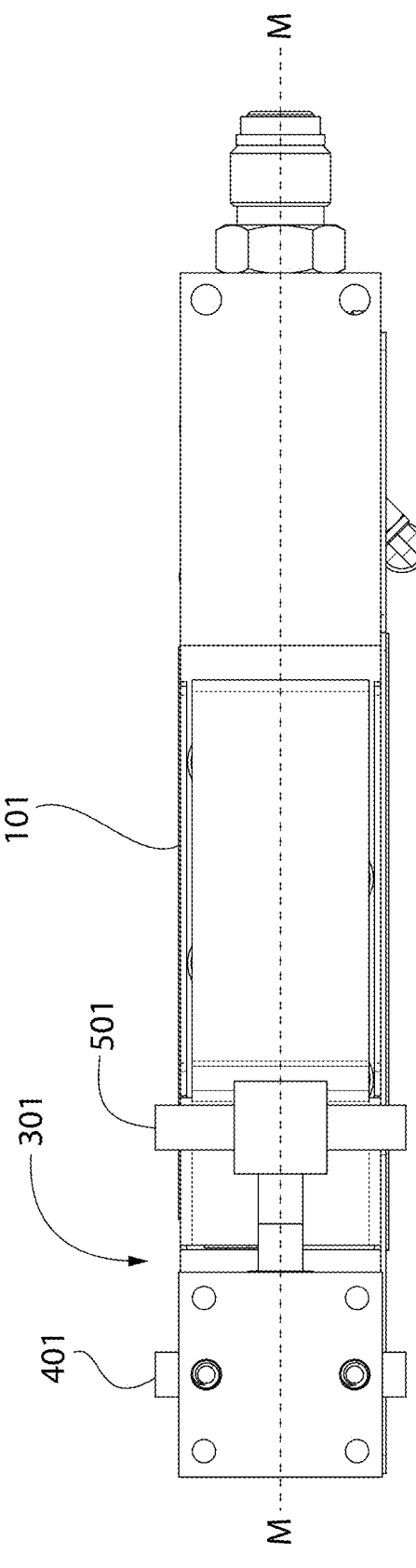
FIG. 12 is a bottom view of the mass flow controller and the portion of the manifold system of FIG. 5.

Turning to FIG. 4, a perspective view of a plurality of apparatuses for controlling flow 100 and a manifold system 300 are shown. As can be seen, six apparatuses 100 are provided in a row. In this example, each of the apparatuses 100 are mass flow controllers 101, but each of the apparatuses 100 could be different devices. Furthermore, not every mass flow controller 101 need be identical. Some may support different fluids, different ranges of flow capability, or any other variation necessary to implement the desired process. As can be seen, the mass flow controllers 101 are mounted to the manifold system 300.

FIGS. 5-13 show a single mass flow controller 101 in greater detail, along with a portion 301 of the manifold system 300. The portion 301 provides the necessary attachment features to mount the mass flow controller 101 or other apparatuses 100 in a standardized configuration. The manifold system 300 comprises both the vacuum and outlet manifolds.

Figure 13:
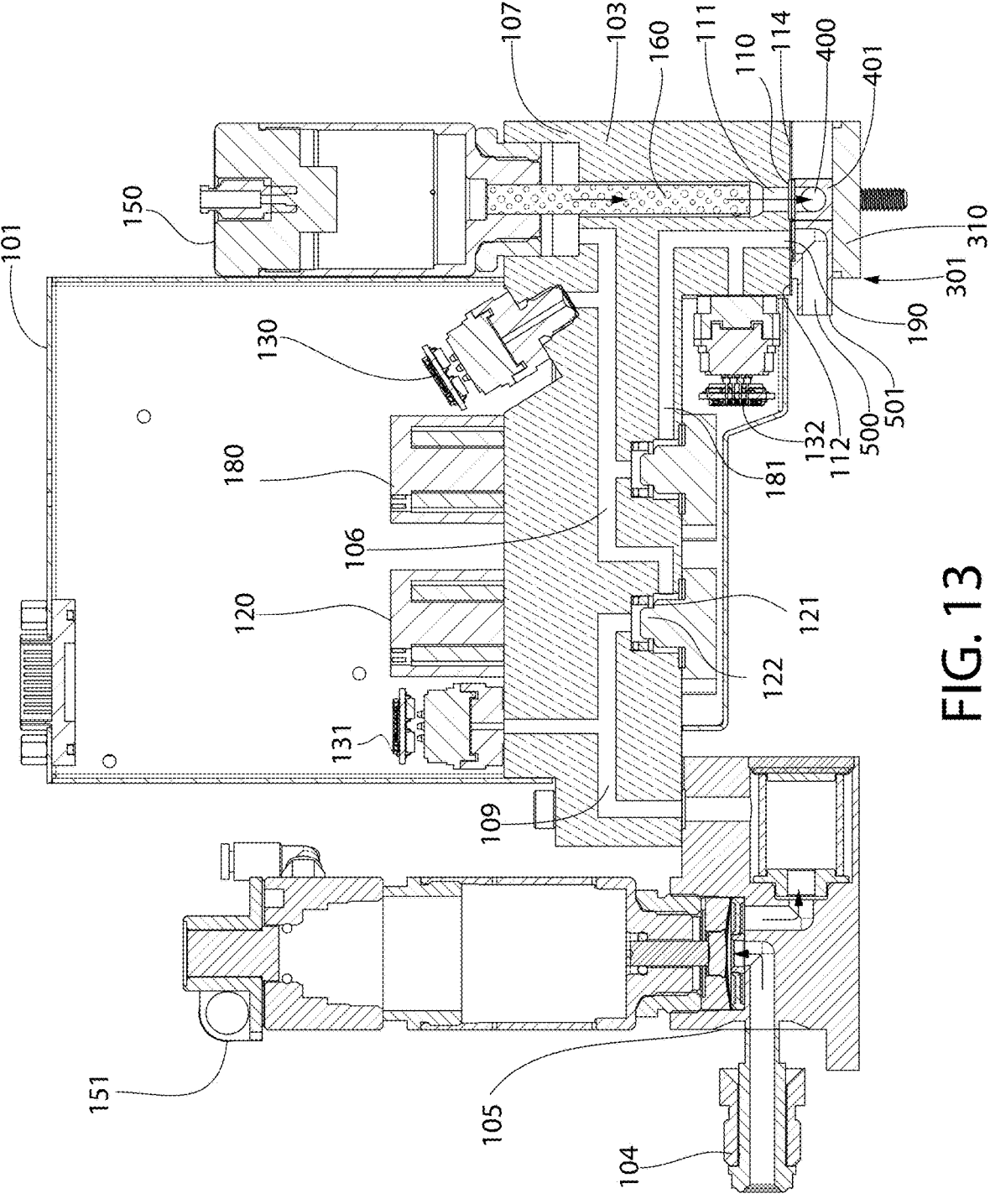
FIG. 13 is a cross-sectional view of the mass flow controller and the portion of the manifold system of FIG. 9, taken along line XIII-XIII.

Turning to FIG. 13, a cross-section of the mass flow controller 101 and the portion 301 of the manifold system 300 are shown. The mass flow controller 101 comprises a base 103 formed of a first portion 105 and a second portion 107. In some embodiments the base 103 is unitary and monolithic, while in other instances the base 103 may be formed of more than two portions. The base 103 comprises an inlet 104 and an outlet 110, a flow path extending from the inlet 104 to the outlet 110. The inlet 104 is fluidly coupled to a fluid supply 102 as discussed above. Process fluids flow from the inlet 104 to the outlet 110 along the flow path, the inlet 104 being referred to as upstream and the outlet 110 being referred to as downstream, as this is the ordinary direction for fluid flow during operation of the mass flow controller 101. Both the inlet 104 and the outlet 110 lie in a plane M-M which extends through the center of the mass flow controller 101 as shown in FIGS. 5-12.

The inlet 104 is fluidly coupled to an inlet control valve 151, the inlet control valve 151 serving to control the flow of fluid into the mass flow controller 101. The primary function of the inlet control valve 151 is to provide guaranteed shutoff of the mass flow controller 101 for maintenance, service, calibration, etc. The inlet control valve 151 may be manually or automatically operated. In some embodiments, the inlet control valve 151 may be omitted.

Fluid flows from the inlet control valve 151 to a proportional valve 120. The proportional valve 120 comprises the valve seat 122 and a closure member 121. The proportional valve is configured to transition from a closed state to an open state as well as any intermediate position between the open and the closed states. This allows a variable volumetric flow rate of gas or liquid to pass the proportional valve 120. Downstream of the proportional valve 120 is a shutoff valve 150 and a characterized restrictor 160. As discussed above, the shutoff valve 150 may be upstream or downstream of the characterized restrictor 160. In this embodiment, the volume between the proportional valve 120 and the characterized restrictor 160 is referred to as a P1 volume 106. The P1 volume 106 comprises all volume in the flow path between the valve seat of the proportional valve 120 and the characterized restrictor 160.

A bleed valve 180 and a P1 pressure transducer 130 are fluidly coupled to the P1 volume 106 between the proportional valve 120 and the characterized restrictor 160. The bleed valve 180 comprises a closure member and a valve seat. The P1 pressure transducer 130 measures the pressure of the fluid in the P1 volume 106. The bleed valve 180 is configured to vent fluid from the P1 volume 106 to a bleed port 190. The bleed port 190 is connected to the vent manifold 500 to dispose of process fluids.

The characterized restrictor 160 is located downstream of the shutoff valve 150 and upstream of the outlet 110 as discussed above. The characterized restrictor 160 is configured such that it provides a restriction to fluid flow to provide a pressure differential between the P1 volume 106 and a P2 volume 111. The P2 volume 111 comprises the volume of the flow path between the characterized restrictor 160 and the outlet 110. The P2 volume 111 is fluidly coupled to a P2 pressure transducer 132, the P2 pressure transducer 132 measuring the pressure of the fluid in the P2 volume 111. The restriction to fluid flow of the characterized restrictor 160 may also be referred to as a flow impedance, the flow impedance being sufficiently high that the pressure drop across the characterized restrictor 160 can be measured using the P1 and P2 pressure transducers 130, 132.

In some embodiments, the characterized restrictor 160 may be upstream of the shutoff valve 150. In some embodiments, the characterized restrictor 160 may be at least partially located within the shutoff valve 150. In yet other embodiments, the shutoff valve 150 may be omitted. The P1 and P2 pressure transducers 130, 132 may also be omitted in certain embodiments. In yet other embodiments, one or more of the P0, P1, and P2 pressure transducers 131, 130, 132 may be differential pressure sensors, and may be fluidly coupled to more than one of the P0, P1, and P2 volumes 109, 106, 111 to permit differential pressure measurement between the P0, P1, and P2 volumes 109, 106, 111.

Returning to the bleed valve 180 and the bleed port 190, it can be seen that the bleed valve 180 controls flow through a bleed passage 181 that connects the bleed valve 180 to the bleed port 190. This bleed passage 181 may take any required path to reach a mounting portion 112. The mounting portion 112 forms a portion of the base 103 and has a surface 114 comprising the bleed port 190 and the outlet 110. In a preferred embodiment, the surface 114 of the mounting portion 112 is planar. The mounting portion 112 enables connection of the mass flow controller 101 to the portion 301 of the manifold system 300.

The portion 301 of the manifold system 300 comprises a portion 501 of the vent manifold 500 and a portion 401 of the outlet manifold 400. The portion 301 of the manifold system 300 further comprises a mounting substrate 310. The mounting substrate 310 provides the mechanical connection for the mounting portion 112 of the mass flow controller 101. The mounting substrate 310 provides both structural strength and rigidity to the mass flow controller 101 and ensures robust fluid connection between the two components. The mounting portion 112 of the mass flow controller 101 is configured to engage the mounting substrate 310 to fluidly couple the outlet 110 and the bleed port 190 to the vent manifold 500 and the outlet manifold 400. The surface 114 of the mounting portion 112 may incorporate features necessary to ensure that the bleed port 190 and outlet 110 can be adequately sealed to ensure liquid and/or gas tight connections between the mounting portion 112 and the mounting substrate 310. These features may include recesses or any other feature necessary to provide room for sealing features, seals, or other components that provide a fluid-tight connection.

Figure 14:
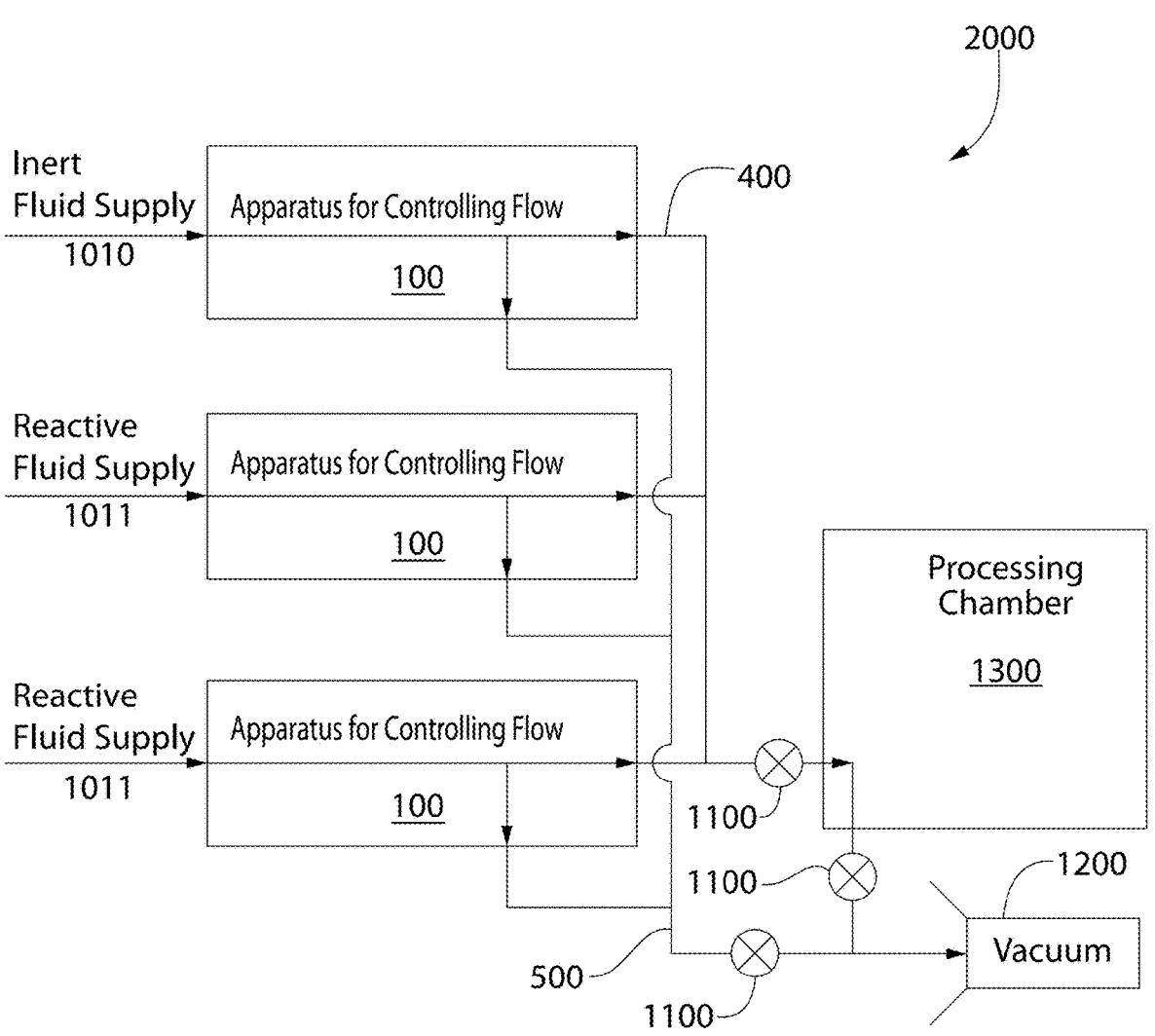
FIG. 14 is a schematic view of another exemplary processing system.

Turning to FIG. 14, an exemplary processing system 2000 is shown. The processing system 2000 is similar to the processing system 1000 except as discussed herein. The processing system comprises an inert fluid supply 1010 which supplies a process fluid which is inert. This may be an inert liquid or an inert gas. Examples may include inert gases such as nitrogen, argon, helium, or any of the noble gases. Thus, the inert fluid supply 1010 supplies a fluid which is chemically inert. The processing system 2000 also comprises two reactive fluid supplies 1011. Each of the reactive fluid supplies 1011 supply reactive fluids such as hydrofluoric or hydrochloric acid, oxygen, or any other reactive liquid or gas as may be desired. The reactive fluid supplies 1011 need not supply the same reactive fluid and preferably each supply a different reactive fluid. There may be more than one inert fluid supply 1010 and more than two reactive fluid supplies 1011 depending on processing requirements. In yet other embodiments, the inert fluid supply 1010 may supply a chemically reactive fluid which is not chemically reactive with the reactive fluid supplies 1011. In other words, mixing the fluid from the inert fluid supply 1010 will result in no reaction with the fluid of the reactive fluid supplies 1011 but the fluid from the inert fluid supply 1010 will react with other fluids or materials.

The processing system 2000 comprises a plurality of apparatuses for controlling flow 100, an outlet manifold 400, a vent manifold 500, and a plurality of valves 1100 used to selectively isolate the outlet and vent manifolds 400, 500 from a processing chamber 1300 and a vacuum source 1200. In yet other implementations, some of the apparatuses for controlling flow 100 may be exclusively coupled to the outlet manifold 400 or the vent manifold 500. Thus, it is conceived that one of the apparatuses for controlling flow 100 may exclusively be coupled to the outlet manifold 400. It is also conceived that one of the apparatuses for controlling flow 100 may be exclusively coupled to the vent manifold 500. In some implementations, the apparatus for controlling flow 100 which supplies an inert fluid from the inert fluid supply 1010 may be exclusively coupled to the vent manifold 500.

Figure 15:
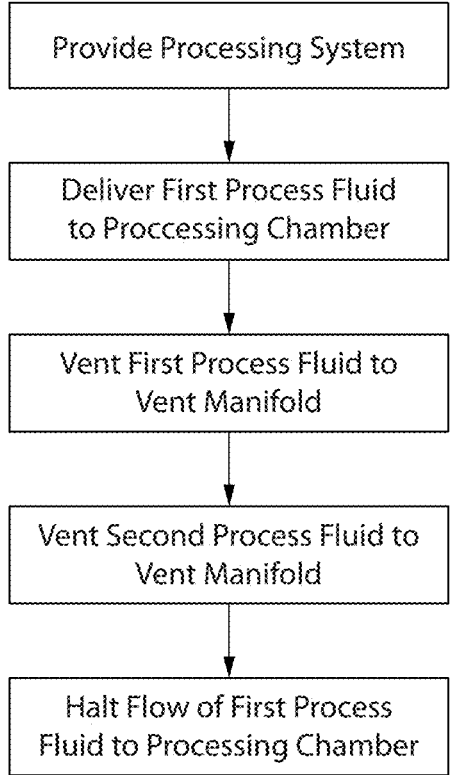
FIG. 15 is a flow chart illustrating a first method of controlling fluid flow.

FIG. 15 illustrates a method of controlling fluid flow using the processing system 2000. First, the processing system 2000 is provided, the processing system 2000 configured to supply a first process fluid from a first reactive fluid supply 1011 to an inlet 104 of a first apparatus for controlling flow 100. The processing system 2000 is also configured to supply a second process fluid from a first inert fluid supply 1010 to an inlet 104 of a second apparatus for controlling flow 100. Each of the first and second apparatuses 100 have an outlet 110 fluidly coupled to the outlet manifold 400 and a bleed port 190 fluidly coupled to the vent manifold 500. The outlet manifold 400 is fluidly coupled to the processing chamber 1300 while the vent manifold 500 is fluidly coupled to the vacuum source 1200. Preferably, the first process fluid is reactive while the second process fluid is inert.

Subsequent to providing the processing system 2000, the first process fluid is delivered to the processing chamber 1300. The first process fluid is flowed through the first apparatus for controlling flow 100 from the inlet 104 to the outlet 110, through the outlet manifold 400, and on to the processing chamber 1300. Optionally, the first process fluid may be flowed at a known mass or volume flow rate to the processing chamber 1300 depending on the process requirements and the capabilities of the apparatus for controlling flow 100. Then, the first process fluid is vented from the first apparatus for controlling flow 100 via the bleed port 190 to the vent manifold 500 and on to the vacuum source 1200.

The first process fluid is preferably vented at a first flow rate to maintain a concentration of the first process fluid within the vent manifold 500. Preferably, the first flow rate is below a first threshold and the concentration is below a second threshold. The first and second thresholds are selected to minimize risk of undesired reactions of the first process fluid with other process fluids within the vent manifold 500. These values may be stored in a memory of the controller 250 and selected by a user such as a process engineer or technician.

Optionally, the first process fluid may be flowed through the outlet 110 to the processing chamber 1300 prior to venting the process fluid through the bleed port 190 to the vacuum source 1200. Optionally, the first process fluid may be flowed to the processing chamber 1300 concurrently with venting to the vacuum source 1200 or the process fluid may be flowed to the process chamber 1300 only until it is vented to the vacuum source 1200. Thus, the first process fluid may be delivered to the processing chamber 1300 prior to or concurrently with venting to the vacuum source 1200. The flow rate through the outlet 110 need not be equal to the flow rate through the bleed port 190.

Subsequent to venting of the first process fluid to the vent manifold 500, the second process fluid may be vented to the vacuum manifold 500 via the bleed port 190 of the second apparatus for controlling flow 100. Thus, the second process fluid is an inert fluid which serves as a buffer between the first process fluid within the vent manifold 500 and any subsequent process fluids. The second process fluid may be flowed at a controlled flow rate to achieve a target concentration of the first process fluid within the vent manifold 500 or it may simply be flowed at an arbitrary flow rate to dilute the first process fluid. Finally, the flow of the first process fluid from the outlet 110 to the processing chamber 1300 is halted. This may be done prior to or subsequent to the flowing of the second process fluid into the vent manifold 500. The sequencing of the delivery of the first process fluid, venting of the first process fluid, venting of the second process fluid, and halting of the first process fluid can be varied. Venting and delivery can occur simultaneously if so desired.

In yet further steps, the processing system 2000 may comprise a third process fluid supplied from a second reactive fluid supply 1011 to an inlet 104 of a third apparatus for controlling flow 100. Preferably, the third process fluid is reactive. Optionally, the third process fluid is flowed from the outlet 110 of the third apparatus for controlling flow 100 to the processing chamber 1300. Either concurrently or subsequently, the third process fluid may be flowed out of the bleed port 190 of the third apparatus for controlling flow 100 to the vent manifold 500.

The third process fluid is preferably vented at a second flow rate to maintain a concentration of the third process fluid within the vent manifold 500. Preferably, the second flow rate is below a third threshold and the concentration is below a fourth threshold. The third and fourth thresholds are selected to minimize risk of undesired reactions of the third process fluid with other process fluids within the vent manifold 500. These values may be stored in a memory of the controller 250 and selected by a user such as a process engineer or technician.

Figure 16:
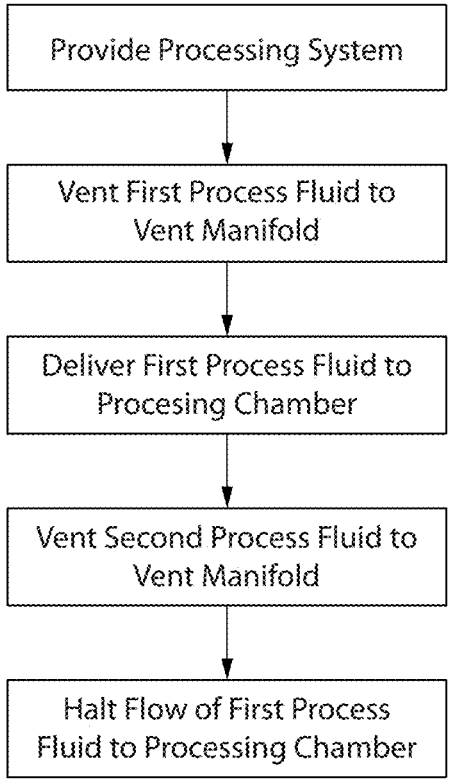
FIG. 16 is a flow chart illustrating a second method of controlling fluid flow.

Turning to FIG. 16, another method of controlling flow is illustrated. In the method of FIG. 16, the processing system 2000 is provided. As with FIG. 15, the processing system 2000 comprises a first reactive fluid supply 1011 coupled to a first apparatus for controlling flow 100 and configured to supply a first process fluid. The processing system 2000 also comprises a first inert fluid supply 1010 coupled to a second apparatus for controlling flow 100 and configured to supply a first process fluid. Preferably, the first process fluid is reactive while the second process fluid is inert as above. The first process fluid is delivered to the vent manifold 500 via the bleed port 190 of the first apparatus for controlling flow 100. The first process fluid is delivered at a first flow rate.

Then, the first process fluid is delivered to the outlet 110 of the first apparatus for controlling flow and then on to the processing chamber 1300. The first process fluid may be simultaneously or sequentially delivered to the vent manifold 500 and the processing chamber 1300. The first process fluid is preferably vented at the first flow rate to maintain a concentration of the first process fluid within the vent manifold 500. Preferably, the first flow rate is below a first threshold and the concentration is below a second threshold. The first and second thresholds are selected to minimize risk of undesired reactions of the first process fluid with other process fluids within the vent manifold 500. These values may be stored in a memory of the controller 250 and selected by a user such as a process engineer or technician.

Thus, it is clear that, depending on the process requirements and other considerations, the first process fluid may be flowed to the processing chamber 1300 before, after, or concurrently with venting to the vent manifold 500. Furthermore, the second process fluid may be delivered to the bleed port 190 of the second apparatus for controlling flow and then on to the vent manifold 500 either concurrently or subsequently to the delivery of the first process fluid to the vent manifold 500. The delivery of the second process fluid occurs independently of the delivery of the first process fluid to the processing chamber 1300 and may also occur concurrently with the delivery of the first process fluid to the processing chamber 1300 or after delivery of the first process fluid to the processing chamber 1300. Finally, the flow of the first process fluid to the processing chamber 1300 is halted.

Further optionally, a third process fluid may be delivered from a second reactive fluid supply 1011 to an inlet 104 of a third apparatus for controlling flow 100. Preferably, the third process fluid is reactive. Optionally, the third process fluid is flowed from the outlet 110 of the third apparatus for controlling flow 100 to the processing chamber 1300. Either concurrently or subsequently, the third process fluid may be flowed out of the bleed port 190 of the third apparatus for controlling flow 100 to the vent manifold 500.

The third process fluid is preferably vented at a second flow rate to maintain a concentration of the third process fluid within the vent manifold 500. Preferably, the second flow rate is below a third threshold and the concentration is below a fourth threshold. The third and fourth thresholds are selected to minimize risk of undesired reactions of the third process fluid with other process fluids within the vent manifold 500. These values may be stored in a memory of the controller 250 and selected by a user such as a process engineer or technician.

As is apparent, it is conceived that the concentration and flow rate of each of the process fluids may be controlled below their respective thresholds so as to ensure that process fluids do not interact within the vent manifold 500. Inert process fluids may be used as buffers or the inert process fluids may be omitted. Optionally, the respective concentrations and flow rates of the reactive process fluids may be controlled below their respective thresholds and the inert process fluid omitted.

While the invention has been described with respect to specific examples including presently preferred modes of carrying out the invention, those skilled in the art will appreciate that there are numerous variations and permutations of the above described systems and techniques. It is to be understood that other embodiments may be utilized, and structural and functional modifications may be made without departing from the scope of the present invention. Thus, the spirit and scope of the invention should be construed broadly as set forth in the appended claims.

Exemplary Claims:

Exemplary Claim 1: A method of controlling fluid flow comprising: providing a processing system comprising a first fluid supply configured to supply a first process fluid, the first fluid supply fluidly coupled to an inlet of a first apparatus for controlling flow, and a second fluid supply configured to supply a second process fluid, the second fluid supply fluidly coupled to a second apparatus for controlling flow; delivering the first process fluid to a processing chamber fluidly coupled to an outlet of the first apparatus for controlling flow; and venting the first process fluid to a vent manifold fluidly coupled to a bleed port of the first apparatus for controlling flow at a first flow rate which is less than a first threshold.

Exemplary Claim 2: The method of exemplary claim 1 wherein the step of venting further comprises venting the second process fluid to the vent manifold via a bleed port of the second apparatus for controlling flow.

Exemplary Claim 3: The method of exemplary claim 2 wherein the first process fluid is reactive and the second process fluid is inert.

Exemplary Claim 4: The method of exemplary claim 2 or exemplary claim 3 wherein the second process fluid is an inert gas.

Exemplary Claim 5: The method of any one of exemplary claims 2 to 4 wherein the second apparatus for controlling flow vents the second process fluid simultaneously with the venting of the first process fluid.

Exemplary Claim 6: The method of any one of exemplary claims 2 to 5 wherein the second apparatus for controlling flow vents the second process fluid at a second flow rate to control a concentration of the first process fluid below a second threshold.

Exemplary Claim 7: The method of any one of exemplary claims 1 to 7 wherein the step of venting is performed subsequent to the step of delivering.

Exemplary Claim 8: The method of any one of exemplary claims 1 to 7 wherein the first apparatus for controlling flow comprises a flow path extending from the inlet to the outlet and the bleed port, a first proportional valve fluidly coupled to the flow path between the inlet and the bleed port and a second proportional valve fluidly coupled to the flow path between the first proportional valve and the bleed port.

Exemplary Claim 9: The method of exemplary claim 8 wherein the second proportional valve is configured to vent the first process fluid at the first flow rate.

Exemplary Claim 10: The method of any one of exemplary claims 1 to 9 wherein the processing system further comprises a controller comprising a memory, the memory of the controller storing the first threshold.

Exemplary Claim 11: A method of controlling fluid flow comprising: providing a processing system comprising a first fluid supply configured to supply a first process fluid, the first fluid supply fluidly coupled to an inlet of a first apparatus for controlling flow, and a second fluid supply configured to supply a second process fluid, the second fluid supply fluidly coupled to a second apparatus for controlling flow; delivering the first process fluid to a processing chamber fluidly coupled to an outlet of the first apparatus for controlling flow; and venting the first process fluid to a vent manifold fluidly coupled to a bleed port of the first apparatus for controlling flow at a first flow rate and simultaneously venting the second process fluid to the vent manifold fluidly coupled to a bleed port of the second apparatus for controlling flow at a second flow rate to control a concentration of the first process fluid within the vent manifold below a second threshold.

Exemplary Claim 12: The method of exemplary claim 11 wherein the first flow rate is less than a first threshold.

Exemplary Claim 13: The method of exemplary claim 11 or exemplary claim 12 wherein the first process fluid is reactive and the second process fluid is inert.

Exemplary Claim 14: The method of any one of exemplary claims 11 to 13 wherein the second process fluid is an inert gas.

Exemplary Claim 15: The method of any one of exemplary claims 11 to 14 wherein the step of venting is performed subsequent to the step of delivering.

Exemplary Claim 16: The method of any one of exemplary claims 11 to 15 wherein the first apparatus for controlling flow comprises a flow path extending from the inlet to the outlet and the bleed port, a first proportional valve fluidly coupled to the flow path between the inlet and the bleed port and a second proportional valve fluidly coupled to the flow path between the first proportional valve and the bleed port.

Exemplary Claim 17: The method of exemplary claim 16 wherein the second proportional valve is configured to vent the first process fluid at the first flow rate.

Exemplary Claim 18: The method of any one of exemplary claims 11 to 17 wherein the processing system further comprises a controller comprising a memory, the memory of the controller storing the second threshold.

Exemplary Claim 19: A method of controlling fluid flow comprising: providing a processing system comprising a first fluid supply configured to supply a first process fluid, the first fluid supply fluidly coupled to an inlet of a first apparatus for controlling flow, and a second fluid supply configured to supply a second process fluid, the second fluid supply fluidly coupled to a second apparatus for controlling flow; venting the first process fluid to a vent manifold fluidly coupled to a bleed port of the first apparatus for controlling flow at a first flow rate, a concentration of the first process fluid within the vent manifold being below a second threshold; and delivering the first process fluid to a processing chamber fluidly coupled to an outlet of the first apparatus for controlling flow.

Exemplary Claim 20: The method of exemplary claim 19 wherein the step of venting further comprises venting the second process fluid to the vent manifold via a bleed port of the second apparatus for controlling flow.

Exemplary Claim 21: The method of exemplary claim 20 wherein the first process fluid is reactive and the second process fluid is inert.

Exemplary Claim 22: The method of exemplary claim 20 or exemplary claim 21 wherein the second process fluid is an inert gas.

Exemplary Claim 23: The method of any one of exemplary claims 20 to 22 wherein the second apparatus for controlling flow vents the second process fluid simultaneously with the venting of the first process fluid.

Exemplary Claim 24: The method of any one of exemplary claims 20 to 23 wherein the second apparatus for controlling flow vents the second process fluid at a second flow rate to control a concentration of the first process fluid below a second threshold.

Exemplary Claim 25: The method of any one of exemplary claims 19 to 24 wherein the step of venting is performed prior to the step of delivering.

Exemplary Claim 26: The method of any one of exemplary claims 19 to 25 wherein the first apparatus for controlling flow comprises a flow path extending from the inlet to the outlet and the bleed port, a first proportional valve fluidly coupled to the flow path between the inlet and the bleed port and a second proportional valve fluidly coupled to the flow path between the first proportional valve and the bleed port.

Exemplary Claim 27: The method of exemplary claim 26 wherein the second proportional valve is configured to vent the first process fluid at the first flow rate.

Exemplary Claim 28: The method of any one of exemplary claims 19 to 27 wherein the processing system further comprises a controller comprising a memory, the memory of the controller storing the first threshold.

What is claimed is:

1. A method of controlling fluid flow comprising:
   providing a processing system comprising a first fluid supply configured to supply a first process fluid, the first fluid supply fluidly coupled to an inlet of a first apparatus for controlling flow, and a second fluid supply configured to supply a second process fluid, the second fluid supply fluidly coupled to an inlet of a second apparatus for controlling flow;
   delivering the first process fluid to a processing chamber fluidly coupled to an outlet of the first apparatus for controlling flow; and
   venting the first process fluid to a vent manifold fluidly coupled to a bleed port of the first apparatus for controlling flow through the bleed port into the vent manifold at a first flow rate which is less than a first threshold and venting the second process fluid to the vent manifold fluidly coupled to a bleed port of the second apparatus for controlling flow through the bleed port into the vent manifold at a second flow rate, the second flow rate controlled by a proportional valve to control a concentration of the first process fluid below a second threshold.

2. The method of claim 1 wherein the first apparatus for controlling flow comprises a flow restrictor and a bleed valve configured to control flow from the bleed port of the first apparatus for controlling flow, the bleed valve preventing flow through the flow restrictor in a closed state.

3. The method of claim 1 wherein the first process fluid is reactive and the second process fluid is inert.

4. The method of claim 1 wherein the second apparatus for controlling flow vents the second process fluid simultaneously with the venting of the first process fluid.

5. The method of claim 1 wherein the step of venting is performed subsequent to the step of delivering.

6. The method of claim 1 wherein the first apparatus for controlling flow comprises a flow path extending from the inlet to the outlet and the bleed port, a first proportional valve fluidly coupled to the flow path between the inlet and the bleed port and a second proportional valve fluidly coupled to the flow path between the first proportional valve and the bleed port; and wherein the second proportional valve is configured to vent the first process fluid at the first flow rate.

7. The method of claim 1 wherein the processing system further comprises a controller comprising a memory, the memory of the controller storing the first threshold.

8. The method of claim 1 wherein the venting of the first process fluid is controlled by a proportional valve and a controller.

9. A method of controlling fluid flow comprising:
   providing a processing system comprising a first fluid supply configured to supply a first process fluid, the first fluid supply fluidly coupled to an inlet of a first apparatus for controlling flow, and a second fluid supply configured to supply a second process fluid, the second fluid supply fluidly coupled to a second apparatus for controlling flow;
   delivering the first process fluid to a processing chamber fluidly coupled to an outlet of the first apparatus for controlling flow; and
   venting the first process fluid to a vent manifold fluidly coupled to a bleed port of the first apparatus for controlling flow at a first flow rate and simultaneously venting the second process fluid to the vent manifold fluidly coupled to a bleed port of the second apparatus for controlling flow at a second flow rate to control a concentration of the first process fluid within the vent manifold below a second threshold, the second flow rate actively controlled by a proportional valve of the second apparatus for controlling flow to maintain the concentration of the first process fluid below the second threshold.

10. The method of claim 9 wherein the first flow rate is less than a first threshold.

11. The method of claim 9 wherein the first process fluid is reactive and the second process fluid is inert.

12. The method of claim 9 wherein the step of venting is performed subsequent to the step of delivering.

13. The method of claim 9 wherein the first apparatus for controlling flow comprises a flow path extending from the inlet to the outlet and the bleed port, a first proportional valve fluidly coupled to the flow path between the inlet and the outlet and a second proportional valve fluidly coupled to the flow path between the first proportional valve and the bleed port; and wherein the second proportional valve is configured to vent the first process fluid at the first flow rate.

14. The method of claim 9 wherein the processing system further comprises a controller comprising a memory, the memory of the controller storing the second threshold.

15. A method of controlling fluid flow comprising:

providing a processing system comprising a first fluid supply configured to supply a first process fluid, the first fluid supply fluidly coupled to an inlet of a first apparatus for controlling flow, and a second fluid supply configured to supply a second process fluid, the second fluid supply fluidly coupled to a second apparatus for controlling flow;

venting the first process fluid to a vent manifold fluidly coupled to a bleed port of the first apparatus for controlling flow at a first flow rate into the vent manifold, a concentration of the first process fluid within the vent manifold being below a threshold; and delivering the first process fluid to a processing chamber fluidly coupled to an outlet of the first apparatus for controlling flow;

wherein the first apparatus for controlling flow comprises a flow restrictor configured to control flow from the bleed port of the first apparatus for controlling flow, a bleed valve of the first apparatus for controlling flow preventing flow through the flow restrictor when the bleed valve is in a closed state.

16. The method of claim 15 wherein the step of venting further comprises venting the second process fluid to the vent manifold via a bleed port of the second apparatus for controlling flow; and wherein the first process fluid is reactive and the second process fluid is inert.

17. The method of claim 16 wherein the second apparatus for controlling flow vents the second process fluid simultaneously with the venting of the first process fluid.

18. The method of claim 15 wherein the second apparatus for controlling flow vents the second process fluid at a second flow rate to control a concentration of the first process fluid below a second threshold.

19. The method of claim 15 wherein the first apparatus for controlling flow comprises a flow path extending from the inlet to the outlet and the bleed port, a first proportional valve fluidly coupled to the flow path between the inlet and the outlet and the bleed valve fluidly coupled to the flow path between the first proportional valve and the bleed port.

* * * * *